(12) United States Patent
Sharma et al.

(10) Patent No.: US 8,791,499 B1
(45) Date of Patent: Jul. 29, 2014

(54) GAN CONTAINING OPTICAL DEVICES AND METHOD WITH ESD STABILITY

(75) Inventors: Rajat Sharma, Goleta, CA (US); Eric M. Hall, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 192 days.

(21) Appl. No.: 12/785,953

(22) Filed: May 24, 2010

Related U.S. Application Data

(60) Provisional application No. 61/181,515, filed on May 27, 2009.

(51) Int. Cl.
*H01L 29/861* (2006.01)

(52) U.S. Cl.
USPC .................. 257/103; 257/94; 257/E33.002

(58) Field of Classification Search
USPC .................. 257/98–100, 94, 103, E33.002, 257/E33.003, E33.043
See application file for complete search history.

(56) References Cited

U.S. PATENT DOCUMENTS

| | | | |
|---|---|---|---|
| 4,065,688 A | 12/1977 | Thornton | |
| 4,870,045 A | 9/1989 | Gasper et al. | |
| 5,331,654 A | 7/1994 | Jewell et al. | |
| 5,607,899 A | 3/1997 | Yoshida et al. | |
| 5,632,812 A | 5/1997 | Hirabayashi | |
| 5,764,674 A * | 6/1998 | Hibbs-Brenner et al. | 372/46.015 |
| 5,813,753 A | 9/1998 | Vriens et al. | |
| 6,204,602 B1 | 3/2001 | Yang et al. | |
| 6,335,771 B1 | 1/2002 | Hiraishi | |
| 6,498,355 B1 | 12/2002 | Harrah et al. | |
| 6,501,154 B2 * | 12/2002 | Morita et al. | 257/628 |
| 6,509,651 B1 | 1/2003 | Matsubara et al. | |
| D471,881 S | 3/2003 | Hegde | |
| 6,533,874 B1 | 3/2003 | Vaudo et al. | |
| 6,547,249 B2 | 4/2003 | Collins, III et al. | |
| 6,639,925 B2 | 10/2003 | Niwa et al. | |
| 6,680,959 B2 | 1/2004 | Tanabe et al. | |
| 6,734,461 B1 | 5/2004 | Shiomi et al. | |
| 6,787,999 B2 | 9/2004 | Stimac et al. | |
| 6,809,781 B2 | 10/2004 | Setlur et al. | |

(Continued)

FOREIGN PATENT DOCUMENTS

| | | |
|---|---|---|
| EP | 2381490 | 10/2011 |
| JP | 06-334215 | 12/1994 |

(Continued)

OTHER PUBLICATIONS

Haskell et al (Defect Reduction in (1100) m-plane gallium nitride via laterla epitaxial overgrowth by hydride vapor phase epitaxy, Applied Physics Letters 86, 111917 (2005), pp. 1-3).*

(Continued)

*Primary Examiner* — Matthew W Such
*Assistant Examiner* — Ali Naraghi
(74) *Attorney, Agent, or Firm* — Kilpatrick Townsend & Stockton LLP

(57) ABSTRACT

An improved laser light emitting diode. The device has a gallium nitride substrate structure, which includes a surface region. The device also has an epitaxial layer overlying the surface region and a p-n junction formed within a portion of the epitaxial layer. In a preferred embodiment, the device also has one or more plane or line defects spatially configured in a manner to be free from intersecting the p-n junction, the one or more plane or line defects being at least $1 \times 10^6$ cm$^{-2}$.

9 Claims, 6 Drawing Sheets

(56) References Cited

U.S. PATENT DOCUMENTS

| | | |
|---|---|---|
| 6,858,882 B2 | 2/2005 | Tsuda et al. |
| 6,936,488 B2 | 8/2005 | D'Evelyn et al. |
| 6,956,246 B1 | 10/2005 | Epler et al. |
| 6,964,877 B2 | 11/2005 | Chen et al. |
| 7,009,199 B2 | 3/2006 | Hall |
| 7,012,279 B2 | 3/2006 | Wierer, Jr. et al. |
| 7,128,849 B2 | 10/2006 | Setlur et al. |
| D545,457 S | 6/2007 | Chen |
| 7,285,801 B2 | 10/2007 | Eliashevich et al. |
| 7,303,630 B2 | 12/2007 | Motoki et al. |
| 7,341,880 B2 | 3/2008 | Erchak et al. |
| 7,344,279 B2 | 3/2008 | Mueller et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,419,281 B2 | 9/2008 | Porchia et al. |
| D581,583 S | 11/2008 | Peng |
| 7,470,938 B2 | 12/2008 | Lee et al. |
| 7,483,466 B2 | 1/2009 | Uchida et al. |
| 7,489,441 B2 | 2/2009 | Scheible et al. |
| D592,613 S | 5/2009 | Plonski et al. |
| 7,622,742 B2 | 11/2009 | Kim et al. |
| 7,637,635 B2 | 12/2009 | Xiao et al. |
| 7,658,528 B2 | 2/2010 | Hoelen et al. |
| 7,663,229 B2 | 2/2010 | Lu et al. |
| 7,674,015 B2 | 3/2010 | Chien |
| D618,634 S | 6/2010 | Lin et al. |
| 7,733,571 B1 | 6/2010 | Li |
| 7,744,259 B2 | 6/2010 | Walczak et al. |
| D619,551 S | 7/2010 | Lin et al. |
| 7,816,238 B2 | 10/2010 | Osada et al. |
| 7,824,075 B2 | 11/2010 | Maxik |
| 7,858,408 B2 | 12/2010 | Mueller et al. |
| 7,862,761 B2 | 1/2011 | Okushima et al. |
| 7,871,839 B2 | 1/2011 | Lee et al. |
| 7,884,538 B2 | 2/2011 | Mitsuishi et al. |
| 7,923,741 B1 | 4/2011 | Zhai et al. |
| 7,972,040 B2 | 7/2011 | Li et al. |
| 7,993,031 B2 | 8/2011 | Grajcar |
| 8,044,412 B2 | 10/2011 | Murphy et al. |
| D652,564 S | 1/2012 | Maxik |
| 8,142,566 B2 | 3/2012 | Kiyomi et al. |
| 8,188,504 B2 | 5/2012 | Lee |
| 8,198,643 B2 | 6/2012 | Lee et al. |
| 8,207,548 B2 | 6/2012 | Nagai |
| 8,207,554 B2 | 6/2012 | Shum |
| D662,899 S | 7/2012 | Shum et al. |
| D662,900 S | 7/2012 | Shum et al. |
| 8,227,962 B1 | 7/2012 | Su |
| 8,247,886 B1 | 8/2012 | Sharma et al. |
| 8,247,887 B1 | 8/2012 | Raring et al. |
| 8,252,662 B1 | 8/2012 | Poblenz et al. |
| 8,272,762 B2 | 9/2012 | Maxik et al. |
| 8,293,551 B2 | 10/2012 | Sharma et al. |
| 8,310,143 B2 | 11/2012 | Van De Ven et al. |
| 8,314,429 B1 | 11/2012 | Raring et al. |
| 8,324,835 B2 | 12/2012 | Shum et al. |
| D674,960 S | 1/2013 | Chen et al. |
| 8,350,273 B2 | 1/2013 | Vielemeyer |
| 8,405,947 B1 | 3/2013 | Green et al. |
| 8,414,151 B2 | 4/2013 | Allen et al. |
| 8,455,894 B1 | 6/2013 | D'Evelyn et al. |
| 8,502,465 B2 | 8/2013 | Katona et al. |
| 8,524,578 B1 | 9/2013 | Raring et al. |
| 8,525,396 B2 | 9/2013 | Shum et al. |
| 8,575,728 B1 | 11/2013 | Raring et al. |
| 2001/0009134 A1 | 7/2001 | Kim et al. |
| 2001/0043042 A1 | 11/2001 | Murazaki et al. |
| 2001/0048114 A1 | 12/2001 | Morita et al. |
| 2001/0055208 A1 | 12/2001 | Kimura |
| 2002/0070416 A1 | 6/2002 | Morse et al. |
| 2002/0096994 A1 | 7/2002 | Iwafuchi et al. |
| 2002/0105986 A1 | 8/2002 | Yamasaki |
| 2002/0155691 A1 | 10/2002 | Lee et al. |
| 2002/0182768 A1 | 12/2002 | Morse et al. |
| 2003/0000453 A1 | 1/2003 | Unno et al. |
| 2003/0001238 A1 | 1/2003 | Ban |
| 2003/0020087 A1 | 1/2003 | Goto et al. |
| 2003/0039122 A1 | 2/2003 | Cao |
| 2003/0047076 A1 | 3/2003 | Liu |
| 2003/0058650 A1 | 3/2003 | Shih |
| 2003/0164507 A1 | 9/2003 | Edmond et al. |
| 2004/0070004 A1 | 4/2004 | Eliashevich et al. |
| 2004/0080256 A1 | 4/2004 | Hampden-Smith et al. |
| 2004/0104391 A1 | 6/2004 | Maeda et al. |
| 2004/0116033 A1 | 6/2004 | Ouderkirk et al. |
| 2004/0124435 A1 | 7/2004 | D'Evelyn et al. |
| 2004/0161222 A1 | 8/2004 | Niida et al. |
| 2004/0207998 A1 | 10/2004 | Suehiro et al. |
| 2004/0251471 A1 | 12/2004 | Dwilinski et al. |
| 2004/0264195 A1 | 12/2004 | Chang et al. |
| 2005/0087753 A1 | 4/2005 | D'Evelyn et al. |
| 2005/0121679 A1 | 6/2005 | Nagahama et al. |
| 2005/0167680 A1 | 8/2005 | Shei et al. |
| 2005/0174780 A1 | 8/2005 | Park |
| 2005/0199899 A1 | 9/2005 | Lin et al. |
| 2005/0214992 A1* | 9/2005 | Chakraborty et al. ........ 438/172 |
| 2005/0224830 A1 | 10/2005 | Blonder et al. |
| 2005/0263791 A1 | 12/2005 | Yanagihara et al. |
| 2006/0038542 A1 | 2/2006 | Park et al. |
| 2006/0060131 A1 | 3/2006 | Atanackovic |
| 2006/0060872 A1 | 3/2006 | Edmond et al. |
| 2006/0079082 A1 | 4/2006 | Bruhns et al. |
| 2006/0118799 A1 | 6/2006 | D'Evelyn et al. |
| 2006/0163589 A1 | 7/2006 | Fan et al. |
| 2006/0166390 A1 | 7/2006 | Letertre et al. |
| 2006/0169993 A1 | 8/2006 | Fan et al. |
| 2006/0189098 A1 | 8/2006 | Edmond |
| 2006/0213429 A1 | 9/2006 | Motoki et al. |
| 2006/0214287 A1 | 9/2006 | Ogihara et al. |
| 2006/0255343 A1 | 11/2006 | Ogihara et al. |
| 2006/0262545 A1 | 11/2006 | Piepgras et al. |
| 2006/0273339 A1 | 12/2006 | Steigerwald et al. |
| 2007/0007898 A1 | 1/2007 | Bruning |
| 2007/0045200 A1 | 3/2007 | Moon et al. |
| 2007/0054476 A1 | 3/2007 | Nakahata et al. |
| 2007/0093073 A1 | 4/2007 | Farrell, Jr. et al. |
| 2007/0096239 A1 | 5/2007 | Cao et al. |
| 2007/0105351 A1 | 5/2007 | Motoki et al. |
| 2007/0114569 A1 | 5/2007 | Wu et al. |
| 2007/0121690 A1 | 5/2007 | Fujii et al. |
| 2007/0131967 A1 | 6/2007 | Kawaguchi et al. |
| 2007/0202624 A1 | 8/2007 | Yoon et al. |
| 2007/0231978 A1 | 10/2007 | Kanamoto et al. |
| 2007/0264733 A1 | 11/2007 | Choi et al. |
| 2007/0280320 A1 | 12/2007 | Feezell et al. |
| 2007/0284564 A1 | 12/2007 | Biwa et al. |
| 2007/0290224 A1 | 12/2007 | Ogawa |
| 2008/0023691 A1 | 1/2008 | Jang et al. |
| 2008/0030976 A1 | 2/2008 | Murazaki et al. |
| 2008/0049399 A1 | 2/2008 | Lu et al. |
| 2008/0054290 A1 | 3/2008 | Shieh et al. |
| 2008/0073660 A1 | 3/2008 | Ohno et al. |
| 2008/0080137 A1 | 4/2008 | Otsuki et al. |
| 2008/0083929 A1 | 4/2008 | Fan et al. |
| 2008/0087919 A1 | 4/2008 | Tysoe et al. |
| 2008/0099777 A1 | 5/2008 | Erchak et al. |
| 2008/0106212 A1 | 5/2008 | Yen et al. |
| 2008/0121906 A1 | 5/2008 | Yakushiji |
| 2008/0128752 A1 | 6/2008 | Wu |
| 2008/0142781 A1* | 6/2008 | Lee .................................. 257/13 |
| 2008/0158887 A1 | 7/2008 | Zhu et al. |
| 2008/0164489 A1* | 7/2008 | Schmidt et al. ................ 257/102 |
| 2008/0164578 A1 | 7/2008 | Tanikella et al. |
| 2008/0173884 A1 | 7/2008 | Chitnis et al. |
| 2008/0179607 A1 | 7/2008 | DenBaars et al. |
| 2008/0179610 A1 | 7/2008 | Okamoto et al. |
| 2008/0194054 A1 | 8/2008 | Lin et al. |
| 2008/0198881 A1 | 8/2008 | Farrell et al. |
| 2008/0211416 A1 | 9/2008 | Negley et al. |
| 2008/0217745 A1 | 9/2008 | Miyanaga et al. |
| 2008/0230765 A1 | 9/2008 | Yoon et al. |
| 2008/0237569 A1 | 10/2008 | Nago et al. |
| 2008/0266866 A1 | 10/2008 | Tsai |

(56) References Cited

U.S. PATENT DOCUMENTS

| | | |
|---|---|---|
| 2008/0272463 A1 | 11/2008 | Butcher et al. |
| 2008/0282978 A1 | 11/2008 | Butcher et al. |
| 2008/0283851 A1 | 11/2008 | Akita |
| 2008/0284346 A1 | 11/2008 | Lee |
| 2008/0285609 A1 | 11/2008 | Ohta et al. |
| 2008/0298409 A1 | 12/2008 | Yamashita et al. |
| 2008/0303033 A1 | 12/2008 | Brandes |
| 2009/0065798 A1 | 3/2009 | Masui et al. |
| 2009/0072252 A1* | 3/2009 | Son et al. ............. 257/94 |
| 2009/0078955 A1 | 3/2009 | Fan et al. |
| 2009/0081857 A1 | 3/2009 | Hanser et al. |
| 2009/0086475 A1 | 4/2009 | Caruso et al. |
| 2009/0095973 A1 | 4/2009 | Tanaka et al. |
| 2009/0134421 A1 | 5/2009 | Negley |
| 2009/0140279 A1 | 6/2009 | Zimmerman et al. |
| 2009/0146170 A1 | 6/2009 | Zhong et al. |
| 2009/0154166 A1 | 6/2009 | Zhang et al. |
| 2009/0161356 A1 | 6/2009 | Negley et al. |
| 2009/0194796 A1 | 8/2009 | Hashimoto et al. |
| 2009/0195186 A1 | 8/2009 | Guest et al. |
| 2009/0206354 A1 | 8/2009 | Kitano et al. |
| 2009/0227056 A1 | 9/2009 | Kyono et al. |
| 2009/0244899 A1 | 10/2009 | Chyn |
| 2009/0250686 A1 | 10/2009 | Sato et al. |
| 2009/0267098 A1 | 10/2009 | Choi |
| 2009/0273005 A1 | 11/2009 | Lin |
| 2009/0309110 A1 | 12/2009 | Raring et al. |
| 2009/0315480 A1 | 12/2009 | Yan et al. |
| 2009/0321778 A1 | 12/2009 | Chen et al. |
| 2010/0001300 A1 | 1/2010 | Raring et al. |
| 2010/0006873 A1 | 1/2010 | Raring et al. |
| 2010/0025656 A1 | 2/2010 | Raring et al. |
| 2010/0032691 A1 | 2/2010 | Kim |
| 2010/0055819 A1 | 3/2010 | Ohba et al. |
| 2010/0060130 A1 | 3/2010 | Li |
| 2010/0091487 A1 | 4/2010 | Shin |
| 2010/0108985 A1 | 5/2010 | Chung et al. |
| 2010/0109030 A1 | 5/2010 | Krames et al. |
| 2010/0117101 A1 | 5/2010 | Kim et al. |
| 2010/0117106 A1 | 5/2010 | Trottier |
| 2010/0117118 A1 | 5/2010 | Dabiran et al. |
| 2010/0148145 A1* | 6/2010 | Ishibashi et al. ............. 257/13 |
| 2010/0155746 A1 | 6/2010 | Ibbetson et al. |
| 2010/0195687 A1 | 8/2010 | Okamoto et al. |
| 2010/0207502 A1 | 8/2010 | Cao et al. |
| 2010/0207534 A1 | 8/2010 | Dowling et al. |
| 2010/0219505 A1 | 9/2010 | D'Evelyn et al. |
| 2010/0220262 A1 | 9/2010 | DeMille et al. |
| 2010/0240158 A1 | 9/2010 | Ter-Hovhannissian |
| 2010/0264799 A1 | 10/2010 | Liu et al. |
| 2010/0277068 A1 | 11/2010 | Broitzman |
| 2010/0290208 A1 | 11/2010 | Pickard |
| 2010/0295088 A1 | 11/2010 | D'Evelyn et al. |
| 2010/0309943 A1 | 12/2010 | Chakraborty et al. |
| 2010/0320499 A1 | 12/2010 | Catalano et al. |
| 2011/0017298 A1 | 1/2011 | Lee |
| 2011/0032708 A1 | 2/2011 | Johnston et al. |
| 2011/0056429 A1* | 3/2011 | Raring et al. ............. 117/101 |
| 2011/0075694 A1 | 3/2011 | Yoshizumi et al. |
| 2011/0095686 A1 | 4/2011 | Falicoff et al. |
| 2011/0101400 A1 | 5/2011 | Chu et al. |
| 2011/0101414 A1 | 5/2011 | Thompson et al. |
| 2011/0108081 A1 | 5/2011 | Werthen et al. |
| 2011/0124139 A1 | 5/2011 | Chang |
| 2011/0140586 A1 | 6/2011 | Wang |
| 2011/0169406 A1 | 7/2011 | Weekamp et al. |
| 2011/0175200 A1 | 7/2011 | Yoshida |
| 2011/0175510 A1 | 7/2011 | Rains, Jr. et al. |
| 2011/0180781 A1 | 7/2011 | Raring et al. |
| 2011/0182056 A1 | 7/2011 | Trottier et al. |
| 2011/0182065 A1 | 7/2011 | Negley et al. |
| 2011/0186860 A1 | 8/2011 | Enya et al. |
| 2011/0186874 A1 | 8/2011 | Shum |
| 2011/0198979 A1 | 8/2011 | Shum et al. |
| 2011/0204763 A1 | 8/2011 | Shum et al. |
| 2011/0204779 A1 | 8/2011 | Shum et al. |
| 2011/0204780 A1 | 8/2011 | Shum et al. |
| 2011/0216795 A1 | 9/2011 | Hsu et al. |
| 2011/0242823 A1 | 10/2011 | Tracy et al. |
| 2011/0266552 A1 | 11/2011 | Tu et al. |
| 2011/0309734 A1 | 12/2011 | Lin et al. |
| 2012/0007102 A1 | 1/2012 | Feezell et al. |
| 2012/0104412 A1 | 5/2012 | Zhong et al. |
| 2012/0135553 A1 | 5/2012 | Felker et al. |
| 2012/0161626 A1 | 6/2012 | van De Ven et al. |
| 2012/0187412 A1 | 7/2012 | D'Evelyn et al. |
| 2012/0187830 A1 | 7/2012 | Shum et al. |
| 2012/0199841 A1 | 8/2012 | Batres et al. |
| 2012/0288974 A1 | 11/2012 | Sharma et al. |
| 2013/0022758 A1 | 1/2013 | Trottier |
| 2013/0026483 A1 | 1/2013 | Sharma et al. |
| 2013/0058099 A1 | 3/2013 | Shum et al. |
| 2013/0112987 A1 | 5/2013 | Fu et al. |
| 2013/0126902 A1 | 5/2013 | Isozaki et al. |
| 2013/0234108 A1 | 9/2013 | David et al. |

FOREIGN PATENT DOCUMENTS

| | | |
|---|---|---|
| JP | 2007-110090 | 4/2007 |
| JP | 2008-084973 | 4/2008 |
| JP | 2008-172040 | 7/2008 |
| WO | WO 2006/062880 | 6/2006 |
| WO | WO 2009/001039 | 12/2008 |
| WO | WO 2011/054716 | 5/2011 |

OTHER PUBLICATIONS

USPTO Office Action for U.S. Appl. No. 13/025,833 dated Jul. 12, 2012.

Farrell et al., 'Continuous-Wave Operation of AlGaN-Cladding-Free Nonpolar m-Plane InGaN/GaN Laser Diodes,' 2007, Japanese Journal of Applied Physics, vol. 46, No. 32, 2007, pp. L761-L763.

Feezell et al., 'AlGaN-Cladding-Free Nonpolar InGaN/GaN Laser Diodes,' Japanese Journal of Applied Physics, vol. 46, No. 13, 2007, pp. L284-L286.

Kojima et al., 'Stimulated Emission At 474 nm From an InGaN Laser Diode Structure Grown on a (1122) GaN Substrate,' Applied Physics Letters, vol. 91, 2007, pp. 251107-251107-3.

Kubota et al., 'Temperature Dependence of Polarized Photoluminescence From Nonpolar m-Plane InGaN Multiple Quantum Wells for Blue Laser Diodes,' Applied Physics Letter, vol. 92, 2008, pp. 011920-1-011920-3.

PCT Communication Including Partial Search and Examination Report for PCT/US2011/41106, dated Oct. 4, 2011, 2 pages total.

International Search Report for PCT application PCT/US2011/41106 (Jan. 5, 2012).

Tsuda et al., 'Blue Laser Diodes Fabricated on m-Plane GaN Substrates,' Applied Physics Express, vol. 1, 2008, pp. 011104-1-011104-3.

Tyagi et al., 'Semipolar (1011) InGaN/GaN Laser Diodes on Bulk GaN Substrates,' Japanese Journal of Applied Physics, vol. 46, No. 19, 2007, pp. L444-L445.

USPTO Office Action for U.S. Appl. No. 12/478,736 dated Feb. 7, 2012.

USPTO Office Action for U.S. Appl. No. 13/025,791 dated Nov. 25, 2011.

USPTO Office Action for U.S. Appl. No. 13/025,833 dated Dec. 14, 2011.

USPTO Office Action for U.S. Appl. No. 13/025,860 dated Dec. 30, 2011.

USPTO Notice of Allowance for U.S. Appl. No. 13/025,860 dated Jun. 8, 2012.

USPTO Office Action for U.S. Appl. No. 13/025,791 dated Feb. 20, 2013.

USPTO Office Action for U.S. Appl. No. 13/025,849 dated Mar. 15, 2013.

USPTO Notice of Allowance for U.S. Appl. No. 29/399,523 dated Mar. 5, 2012.

USPTO Notice of Allowance for U.S. Appl. No. 29/399,524 dated Mar. 2, 2012.

(56) References Cited

OTHER PUBLICATIONS

International Preliminary Report & Written Opinion of PCT Application No. PCT/US2011/060030 dated Mar. 21, 2012, 11 pgs. total.
CFL Ballast IC Drive LED, www.placardshop.com, Blog, May 22, 2012, 3 pgs.
Rausch, 'Use a CFL ballast to drive LEDs', EDN Network, 2007, pp. 1-2.
USPTO Notice of Allowance for U.S. Appl. No. 13/025,791 dated Jun. 17, 2013.
USPTO Office Action for U.S. Appl. No. 13/025,833 dated Apr. 26, 2013.
USPTO Notice of Allowance for U.S. Appl. No. 13/025,849 dated Sep. 16, 2013, 10 pages.
USPTO Office Action for U.S. Appl. No. 13/274,489 dated Sep. 6, 2013, 13 pages.
USPTO Office Action for U.S. Appl. No. 13/535,142 dated Aug. 1, 2013, 14 pages.
USPTO Notice of Allowance for U.S. Appl. No. 29/423,725 dated Jul. 19, 2013, 11 pages.
Aguilar, 'Ohmic n-contacts to Gallium Nitride Light Emitting Diodes', National Nanotechnologhy Infrastructure Network, 2007, p. 56-81.
Baker et al., 'Characterization of Planar Semipolar Gallium Nitride Films on Spinel Substrates', Japanese Journal of Applied Physics, vol. 44, No. 29, 2005, pp. L920-L922.
Benke et al., 'Uncertainty in Health Risks from Artificial Lighting due to Disruption of Circadian Rythm and Melatonin Secretion: A Review', Human and Ecological Risk Assessment: An International Journal, vol. 19, No. 4, 2013, pp. 916-929.
Cich et al., 'Bulk GaN based violet light-emitting diodes with high efficiency at very high current density', Applied Physics Letters, Nov. 29, 2012, pp. 223509-1-223509-3.
Founta et al., 'Anisotropic Morphology of Nonpolar a-Plane GaN Quantum Dots and Quantum Wells', Journal of Applied Physics, vol. 102, vol. 7, 2007, pp. 074304-1-074304-6.
Hanifin et al., 'Photoreception for Circadian, Neuroendocrine, and Neurobehavioral Regulation', Journal of Physiological Anthropology, vol. 26, 2007, pp. 87-94.
Iso et al., 'High Brightness Blue InGaN/GaN Light Emitting Diode on Nonpolar m-Plane Bulk GaN Substrate', Japanese Journal of Applied Physics, vol. 46, No. 40, 2007, pp. L960-L962.
Kim et al., 'High Brightness Light Emitting Diodes Using Dislocation-Free Indium Gallium Nitride/Gallium Nitride Multiquantum-Well Nanorod Arrays', Nano Letters, vol. 4, No. 6, 2004, pp. 1059-1062.
Lu et al., 'Etch-Pits of GaN Films with Different Etching Methods', Journal of the Korean Physical Society, vol. 45, Dec. 2004, p. S673-S675.
International Search Report & Written Opinion of PCT Application No. PCT/US2013/029453, dated Jul. 25, 2013, 11 pages total.
http://www.philipslumileds.com/products/luxeon-flash, 'LUXEON Flash', Philips Lumileds, Aug. 8, 2013, pp. 1-2.
Rea et al., 'White Lighting', COLOR Research and Application, vol. 38, No. 2, Sep. 3, 2011, pp. 82-92.
Rickert et al., 'n-GaN Surface Treatments for Metal Contacts Studied Via X-ray Photoemission Spectroscopy', Applied Physics Letters, vol. 80, No. 2, Jan. 14, 2002, p. 204-206.
Sato et al., 'High Power and High Efficiency Semipolar InGaN Light Emitting Diodes', Journal of Light and Visible Environment, vol. 32, No. 2, Dec. 13, 2007, pp. 57-60.
Sato et al., 'Optical Properties of Yellow Light-Emitting Diodes Grown on Semipolar (1122) Bulk GaN Substrate', Applied Physics Letters, vol. 92, No. 22, 2008, pp. 221110-1-221110-3.
Selvanathan et al., 'Investigation of Surface Treatment Schemes on n-type GaN and Al 0.20Ga0.80N', Journal of Vacuum Science and Technology B, vol. 23, No. 6, May 10, 2005, p. 2538-2544.
Semendy et al., 'Observation and Study of Dislocation Etch Pits in Molecular Beam Epitaxy Grown Gallium Nitride with the use of Phosphoric Acid and Molten Potassium Hydroxide', Army Research Laboratory, Jun. 2007, 18 pages.

Communication from the Korean Patent Office re 10-2012-7009980 dated Apr. 15, 2013, (6 pages).
Communication from the Japanese Patent Office re 2012-529969, dated Oct. 15, 2013, (6 pages).
Weaver et al., 'Optical Properties of Selected Elements', Handbook of Chemistry and Physics, 94th Edition, 2013-2014, pp. 12-126-12-150.
USPTO Office Action for U.S. Appl. No. 12/481,543 dated Jun. 27, 2011 (9 pages).
USPTO Office Action for U.S. Appl. No. 12/491,169 dated Oct. 22, 2010 (9 pages).
USPTO Office Action for U.S. Appl. No. 12/491,169 dated May 11, 2011 (9 pages).
USPTO Office Action for U.S. Appl. No. 12/497,289 dated Feb. 2, 2012 (6 pages).
USPTO Notice of Allowance for U.S. Appl. No. 12/497,289 dated May 22, 2012 (7 pages).
USPTO Office Action for U.S. Appl. No. 12/569,841 dated Dec. 23, 2011 (12 pages).
USPTO Office Action for U.S. Appl. No. 12/569,841 dated Mar. 26, 2013 (17 pages).
USPTO Office Action for U.S. Appl. No. 12/569,841 dated Aug. 13, 2013 (20 pages).
USPTO Office Action for U.S. Appl. No. 12/569,844 dated Oct. 12, 2012 (12 pages).
USPTO Notice of Allowance for U.S. Appl. No. 12/569,844 dated Mar. 7, 2013 (9 pages).
USPTO Notice of Allowance for U.S. Appl. No. 12/720,593 dated Jul. 11, 2012 (7 pages).
USPTO Office Action for U.S. Appl. No. 12/749,466 dated Jul. 3, 2012 (18 pages).
USPTO Office Action for U.S. Appl. No. 12/749,476 dated Apr. 11, 2011 (14 pages).
USPTO Office Action for U.S. Appl. No. 12/749,476 dated Nov. 8, 2011 (11 pages).
USPTO Notice of Allowance for U.S. Appl. No. 12/749,476 dated May 4, 2012 (8 pages).
USPTO Notice of Allowance for U.S. Appl. No. 12/749,476 dated Jun. 26, 2012 (8 pages).
USPTO Office Action for U.S. Appl. No. 12/861,765 dated Jul. 2, 2012 (11 pages).
USPTO Office Action for U.S. Appl. No. 12/861,765 dated Mar. 7, 2013 (12 pages).
USPTO Office Action for U.S. Appl. No. 12/861,765 dated Sep. 17, 2013 (10 pages).
USPTO Office Action for U.S. Appl. No. 12/879,784 dated Jan. 25, 2012 (6 pages).
USPTO Notice of Allowance for U.S. Appl. No. 12/879,784 dated Apr. 3, 2012 (7 pages).
USPTO Office Action for U.S. Appl. No. 12/880,803 dated Feb. 22, 2012 (8 pages).
USPTO Notice of Allowance for U.S. Appl. No. 12/880,803 dated Jul. 18, 2012 (5 pages).
USPTO Office Action for U.S. Appl. No. 12/936,238 dated Aug. 30, 2012 (11 pages).
USPTO Office Action for U.S. Appl. No. 12/936,238 dated Jan. 30, 2013 (12 pages).
USPTO Notice of Allowance for U.S. Appl. No. 12/936,238 dated Apr. 16, 2013 (9 pages).
USPTO Office Action for U.S. Appl. No. 12/995,946 dated Mar. 28, 2012 (17 pages).
USPTO Office Action for U.S. Appl. No. 12/995,946 dated Jan. 29, 2013 (25 pages).
USPTO Office Action for U.S. Appl. No. 12/995,946 dated Aug. 2, 2013 (15 pages).
USPTO Office Action for U.S. Appl. No. 13/014,622 dated Nov. 28, 2011 (13 pages).
USPTO Office Action for U.S. Appl. No. 13/014,622 dated Apr. 30, 2012 (13 pages).
USPTO Office Action for U.S. Appl. No. 13/019,897 dated Mar. 30, 2012 (14 pages).
USPTO Office Action for U.S. Appl. No. 13/019,897 dated Jan. 16, 2013 (7 pages).

(56) References Cited

OTHER PUBLICATIONS

USPTO Office Action for U.S. Appl. No. 13/019,897 dated Dec. 2, 2013 (17 pages).
USPTO Notice of Allowance for U.S. Appl. No. 13/163,482 dated Jul. 31, 2012 (5 pages).
USPTO Office Action for U.S. Appl. No. 13/179,346 dated Aug. 17, 2012 (17 pages).
USPTO Office Action for U.S. Appl. No. 13/179,346 dated Dec. 13, 2012 (20 pages).
USPTO Office Action for U.S. Appl. No. 13/281,221 dated Jun. 21, 2013 (6 pages).
USPTO Notice of Allowance for U.S. Appl. No. 13/281,221 dated Nov. 12, 2013 (10 pages).
USPTO Office Action for U.S. Appl. No. 13/328,978 dated May 15, 2013 (24 pages).
USPTO Office Action for U.S. Appl. No. 13/328,978 dated Sep. 26, 2013 (25 pages).
USPTO Office Action for U.S. Appl. No. 13/465,976 dated Aug. 16, 2012 (16 pages).
USPTO Office Action for U.S. Appl. No. 13/465,976 dated Dec. 20, 2012 (16 pages).
USPTO Office Action for U.S. Appl. No. 13/548,635 dated Jun. 14, 2013 (5 pages).
USPTO Notice of Allowance for U.S. Appl. No. 13/548,635 dated Sep. 16, 2013 (6 pages).
USPTO Office Action for U.S. Appl. No. 13/548,312 dated Mar. 12, 2013 (5 pages).
USPTO Notice of Allowance for U.S. Appl. No. 13/548,770 dated Jun. 25, 2013 (6 pages).
USPTO Office Action for U.S. Appl. No. 13/629,366 dated Oct. 31, 2013 (7 pages).
USPTO Office Action for U.S. Appl. No. 13/723,968 dated Nov. 29, 2013 (23 pages).

\* cited by examiner (Schematic) Threading dislocations with propagation direction such that they do not intersect the *p-n* junction From
http://www.esda.org/documents/esdfunds5pr
int.pdf

| Class | Voltage Range |
|---|---|
| Class 0 | <250 volts |
| Class 1A | 250 volts to <500 volts |
| Class 1B | 500 volts to < 1,000 volts |
| Class 1C | 1000 volts to < 2,000 volts |
| Class 2 | 2000 volts to < 4,000 volts |
| Class 3A | 4000 volts to < 8000 volts |
| Class 3B | >= 8000 volts |

Figure 6
(Per ESD STM5.1-1998)
From
http://www.esda.org/documents/esdfunds5print.pdf

GAN CONTAINING OPTICAL DEVICES AND METHOD WITH ESD STABILITY

CROSS-REFERENCE TO RELATED APPLICATION

This application claims priority to U.S. Ser. No. 61/181,515, filed May 27, 2009; which is commonly assigned and hereby incorporated by reference.

BACKGROUND OF THE INVENTION

The present invention relates generally to lighting techniques. More specifically, embodiments of the invention include techniques for fabricating an improved optical device with improved electrostatic discharge characteristics fabricated on bulk semipolar or nonpolar crystalline semiconductor materials. Merely by way of example, the invention can be applied to applications such as white lighting, multi-colored lighting, general illumination, decorative lighting, automotive and aircraft lamps, street lights, lighting for plant growth, indicator lights, lighting for flat panel displays, other optoelectronic devices, and the like.

In the late 1800's, Thomas Edison invented the light bulb. The conventional light bulb, commonly called the "Edison bulb," has been used for over one hundred years. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light. Unfortunately, drawbacks exist with the conventional Edison light bulb. That is, the conventional light bulb dissipates much thermal energy. More than 90% of the energy used for the conventional light bulb dissipates as thermal energy. Additionally, the conventional light bulb routinely fails often due to thermal expansion and contraction of the filament element.

To overcome some of the drawbacks of the conventional light bulb, fluorescent lighting has been developed. Fluorescent lighting uses an optically clear tube structure filled with a halogen gas and, which typically also contains mercury. A pair of electrodes is coupled between the halogen gas and couples to an alternating power source through a ballast. Once the gas has been excited, it discharges to emit light. Typically, the optically clear tube is coated with phosphors, which are excited by the light. Many building structures use fluorescent lighting and, more recently, fluorescent lighting has been fitted onto a base structure, which couples into a standard socket.

Solid state lighting techniques have also been used. Solid state lighting relies upon semiconductor materials to produce light emitting diodes, commonly called LEDs. At first, red LEDs were demonstrated and introduced into commerce. Red LEDs use Aluminum Indium Gallium Phosphide or AlInGaP semiconductor materials. Most recently, Shuji Nakamura pioneered the use of InGaN materials to produce LEDs emitting light in the blue color range for blue LEDs. The blue colored LEDs led to innovations such as solid state white lighting, the blue laser diode, which in turn enabled the BlueRay™ DVD player, and other developments. Other colored LEDs have also been proposed.

High intensity UV, blue, and green LEDs based on GaN have been proposed and even demonstrated with some success. Efficiencies have typically been highest in the UV-violet, dropping off as the emission wavelength increases to blue or green. Unfortunately, achieving high intensity, high-efficiency GaN-based green LEDs has been particularly problematic. The performance of optoelectronic devices fabricated on conventional c-plane GaN suffer from strong internal polarization fields, which spatially separate the electron and hole wave functions and lead to poor radiative recombination efficiency. Since this phenomenon becomes more pronounced in InGaN layers with increased indium content for increased wavelength emission, extending the performance of UV or blue GaN-based LEDs to the blue-green or green regime has been difficult. Furthermore, since increased indium content films often require reduced growth temperature, the crystal quality of the InGaN films is degraded. The difficulty of achieving a high intensity green LED has lead scientists and engineers to the term "green gap" to describe the unavailability of such green LED. In addition, the light emission efficiency of typical GaN-based LEDs drops off significantly at higher current densities, as are required for general illumination applications, a phenomenon known as "roll-over." Other limitations with blue LEDs using c-plane GaN exist. These limitations include poor yields, low efficiencies, and reliability issues. Although highly successful, solid state lighting techniques must be improved for full exploitation of their potential. These and other limitations may be described throughout the present specification and more particularly below.

From the above, it is seen that techniques for improving optical devices is highly desired.

BRIEF SUMMARY OF THE INVENTION

According to the present invention, techniques for lighting are provided. More specifically, embodiments of the invention include techniques for fabricating an improved optical device with electrostatic discharge characteristics fabricated on bulk semipolar or nonpolar materials. Merely by way of example, the invention can be applied to applications such as optoelectronic devices, and the like. Other applications that desire polarized emission include liquid crystal display ("LCD") backlighting, liquid crystal on silicon ("LCOS") lighting, selected applications of home and/or building lighting, medical applications, biological sampling, plant and algae growth, biofuels, microscopes, film and video (e.g., amusement, action, nature, in-door), multi-dimensional display or televisions, micro and/or pico displays, health and wellness, optical and/or data transmission/communication, security and safety, and others.

In a specific embodiment, the present invention the present invention provides a light emitting diode device, commonly called an LED, e.g., single LED device, array of LEDs. The device has a gallium nitride (GaN) substrate structure, which includes a surface region. The device also has an epitaxial layer overlying the surface region and a p-n junction formed within a portion of the epitaxial layer. In a preferred embodiment, the device also has one or more plane or line defects spatially configured in a manner to be free from intersecting the p-n junction. In a specific embodiment, the one or more plane or line defects are present at a surface defect density of $1 \times 10^6$ cm$^{-2}$.

Benefits are achieved over pre-existing techniques using the present invention. In particular, the present invention uses either a non-polar or semipolar material, which has improved characteristics. In a specific embodiment, the present method and device using non-polar materials reduces polarization fields, which lead to reduced efficiency and gain. That is, the device has improved efficiency and gain as compared to conventional laser devices made of gallium containing materials made on conventional m-plane technology. In a preferred embodiment, the resulting device is smaller in size and has the capability of achieving power of large conventional devices. In a specific embodiment, the device has improved electrostatic discharge characteristics. Depending upon the embodiment, the present apparatus and method can be manufactured using conventional materials and/or methods according to one of ordinary skill in the art. Depending upon the embodiment, one or more of these benefits may be achieved. These and other benefits may be described throughout the present specification and more particularly below.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIG. 6 is a simplified table of the various classifications of a device based upon the electro-static discharge characteristics tested under the human model circuit according to an embodiment of the present invention.

DETAILED DESCRIPTION OF THE INVENTION

According to the present invention, techniques for lighting are provided. More specifically, embodiments of the invention include techniques for fabricating an improved optical device with electrostatic discharge characteristics fabricated on bulk semipolar or nonpolar materials. Merely by way of example, the invention can be applied to applications such as white lighting, multi-colored lighting, general illumination, decorative lighting, automotive and aircraft lamps, street lights, lighting for plant growth, indicator lights, lighting for flat panel displays, other optoelectronic devices, and the like.

While conventional optical devices have been fabricated on the c-plane of GaN substrates, researchers are exploring the properties of optical devices fabricated on m-plane GaN substrates. Specifically, c-plane bulk GaN is polar, while m-plane bulk GaN is non-polar along the growth direction. LEDs fabricated on the m-plane of bulk GaN substrates can emit highly polarized light. By utilizing non-polar GaN substrate-based LEDs in applications which require polarized light (such as LCD back-lighting), improved system efficiencies can therefore be achieved. Furthermore, optical devices are also fabricated from GaN substrates wherein the largest area surface is angled from the polar c-plane leading to semipolar bulk GaN substrates. LEDs fabricated on bulk semipolar GaN substrates can also emit partially polarized light according to other embodiments. The degree of polarization of the emission can be related to the crystallographic orientation of the largest surface area of the bulk GaN substrate, the composition and constitution of the individual layers that make up the LED structure, the electrical current density at which the polarization ratio is measured, how the measurement occurs, among other factors. Regarding the measurement, complex equipment including selected polarizers, photodetectors, and handling techniques are often required to determine the degree of polarization. The use of non-polar or semi-polar GaN in the fabrication of LEDs allows for the creation of optical devices that produce light of various levels of polarization In order to increase the performance characteristics and reliability of devices fabricated using LEDs fabricated on bulk GaN substrates, it is necessary to improve the electrostatic discharge (ESD) characteristics of such LEDs. Specifically, improving the electrostatic discharge characteristics increases the breakdown voltage of the LED device allowing it to operate at the high currents generated by electro-static discharge. This in turn, leads to reduced device failure frequency and improved reliability. Such improved reliability is extremely noticeable in devices that use multiple arrays of LEDs such as display devices.

Figure 1:
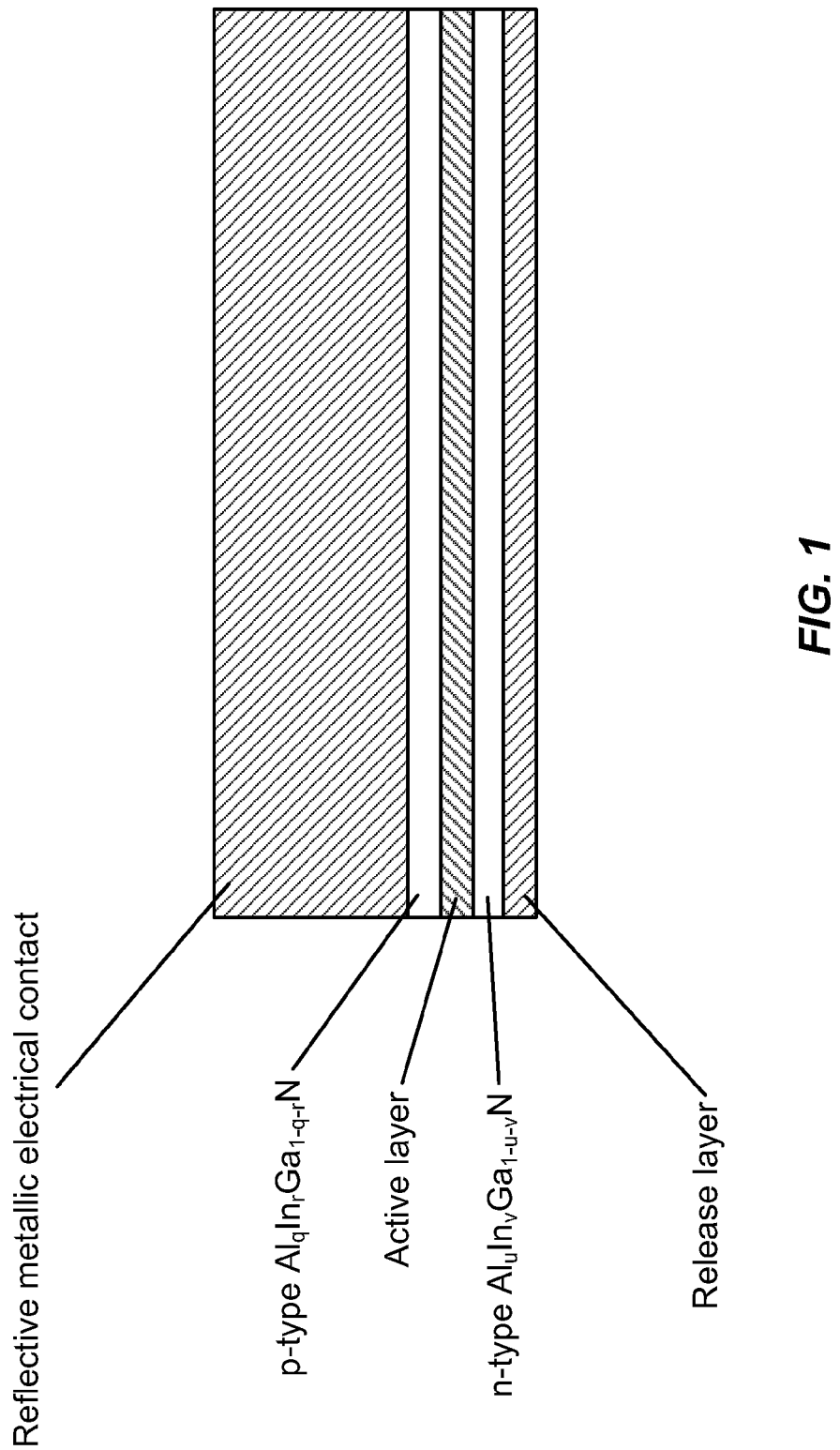
FIG. 1 shows a simplified diagram of a cross sectional view of a sample LED device structure fabricated on a bulk GaN substrate wafer according to an embodiment of the present invention.

FIG. 1 shows a sample LED device fabricated on a bulk GaN substrate wafer. This diagram is merely an example, which should not unduly limit the scope of the claims herein. One of ordinary skill in the art would recognize other variations, modifications, and alternatives. The substrate of the wafer includes a high quality nitride crystal with a release layer, as disclosed in U.S. Patent application 61/091,591, entitled, "NITRIDE CRYSTAL WITH RELEASE LAYER, METHOD OF MAKING, AND METHOD OF USE," commonly assigned, and which is hereby incorporated by reference in its entirety. The nitride crystal comprises nitrogen and has a surface dislocation density below $10^5$ cm$^{-2}$. The nitride crystal or wafer may comprise $Al_xIn_yGa_{1-x-y}N$, where 0≤x, y, x+y≤1. In one specific embodiment, the nitride crystal comprises GaN. In a preferred embodiment, the nitride crystal is substantially free of low-angle grain boundaries, or tilt boundaries, over a length scale of at least 3 millimeters. Optionally, the nitride crystal has a release layer with an optical absorption coefficient greater than 1000 cm-1 at least one wavelength where the base crystal underlying the release layer is substantially transparent, with an optical absorption coefficient less than 50 cm-1, and may further comprise a high quality epitaxial layer, which also has a surface dislocation density below $10^5$ cm$^{-2}$. The release layer may be etched under conditions where the nitride base crystal and the high quality epitaxial layer are not. Of course, there can be other variations, modifications, and alternatives.

The substrate may have a large-surface orientation within ten degrees, within five degrees, within two degrees, within one degree, within 0.5 degree, or within 0.2 degree of (0 0 0 1), (0 0 0 –1), {1 –1 0 0}, {1 1 –2 0}, {1 –1 0 ±1}, {1 –1 0 ±2}, {1 –1 0 ±3}, or {1 1 –2 ±2}. The substrate may have a dislocation density below $10^4$ cm$^{-2}$, below $10^3$ cm$^{-2}$, or below $10^2$ cm$^{-2}$. The nitride base crystal or wafer may have an optical absorption coefficient below 100 cm$^{-1}$, below 50 cm$^{-1}$ or below 5 cm$^{-1}$ at wavelengths between about 465 nm and about 700 nm. The nitride base crystal may have an optical absorption coefficient below 100 cm$^{-1}$, below 50 cm$^{-1}$ or below 5 cm$^{-1}$ at wavelengths between about 700 nm and about 3077 nm and at wavelengths between about 3333 nm and about 6667 nm.

In one or more embodiments, the device can be configured with an optional release layer. The release layer comprises heavily cobalt-doped GaN, has a high crystal quality, and is substantially black, with an optical absorption coefficient greater than 1000 cm$^{-1}$ or greater than 5000 cm$^{-1}$ across the visible spectrum, including the range between about 465 nm and about 700 nm. The release layer is between about 0.05 micron and about 50 microns thick and has a temperature stability approximately the same as the underlying base crystal and exhibits minimal strain with respect to the underlying base crystal.

An n-type $Al_uIn_vGa_{1-u-v}N$ layer, where $0 \leq u, v, u+v \leq 1$, is deposited on the substrate. The carrier concentration may lie in the range between about $10^{17}$ cm$^{-3}$ and $10^{20}$ cm$^{-3}$. The deposition may be performed using metal organic chemical vapor deposition (MOCVD) or molecular beam epitaxy (MBE).

Following deposition of the n-type $Al_uIn_vGa_{1-u-v}N$ layer for a predetermined period of time, so as to achieve a predetermined thickness, an active layer is deposited. The active layer may comprise a single quantum well or a multiple quantum well, with 2-10 quantum wells. The quantum wells may comprise InGaN wells and GaN barrier layers. In other embodiments, the well layers and barrier layers comprise $Al_wIn_xGa_{1-w-x}N$ and $Al_yIn_zGa_{1-y-z}N$, respectively, where $0 \leq w, x, y, z, w+x, y+z \leq 1$, where w<u, y and/or x>v, z so that the bandgap of the well layer(s) is less than that of the barrier layer(s) and the n-type layer. The well layers and barrier layers may each have a thickness between about 1 nm and about 20 nm. In another embodiment, the active layer comprises a double heterostructure, with an InGaN or $Al_wIn_xGa_{1-w-x}N$ layer about 20 nm to about 500 nm thick surrounded by GaN or $Al_yIn_zGa_{1-y-z}N$ layers, where w<u, y and/or x>v, z. The composition and structure of the active layer are chosen to provide light emission at a preselected wavelength. The active layer may be left undoped (or unintentionally doped) or may be doped n-type or p-type.

Next, a p-type doped $Al_qIn_rGa_{1-q-r}N$, where $0 \leq q, r, q+r \leq 1$, layer is deposited above the active layer. The p-type layer may be doped with Mg, to a level between about $10^{17}$ cm$^{-3}$ and $10^{21}$ cm$^{-3}$, and may have a thickness between about 5 nm and about 500 nm. The outermost 1-30 nm of the p-type layer may be doped more heavily than the rest of the layer, so as to enable an improved electrical contact.

A reflective electrical contact, with a reflectivity greater than about 70%, is then deposited on the p-type semiconductor layer or on the second n-type layer above a tunnel junction, if it is present. In another embodiment, the reflective electrical contact is placed on the n-type side of the device structure. In a preferred embodiment, the reflectivity of the reflective electrical contact is greater than 80% or greater than 90%. The reflective electrical contact may comprise at least one of silver, gold, aluminum, nickel, platinum, rhodium, palladium, chromium, or the like. The reflective electrical contact may be deposited by thermal evaporation, electron beam evaporation, sputtering, or another suitable technique. In a preferred embodiment, the reflective electrical contact serves as the p-type electrode for the textured-surface LED. In another embodiment, the reflective electrical contact serves as an n-type electrode for the textured-surface LED. Further details of the present invention are found throughout the present specification and more particularly below. Of course, there can be other variations, modifications, and alternatives.

Figure 2:
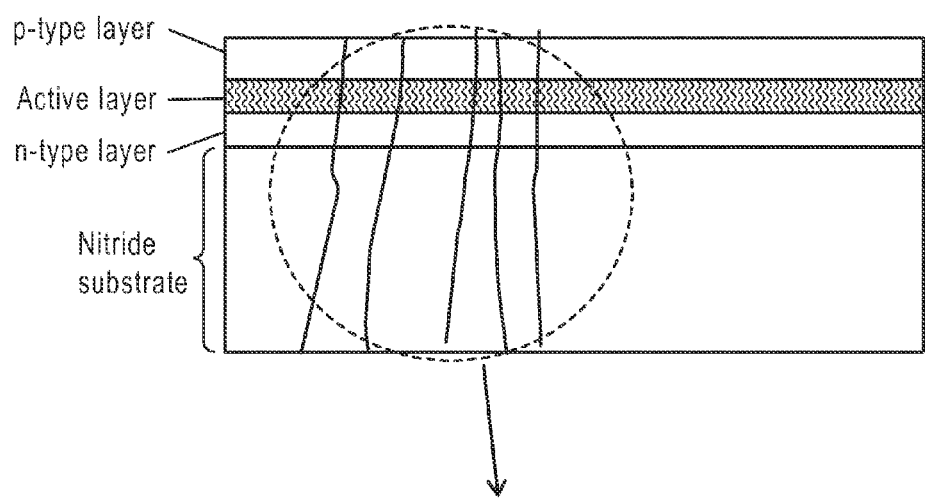
FIG. 2 is a simplified cross-sectional view illustrating an optical device of the prior art.

As is shown in the FIG. 2, a cross sectional view of conventional optical devices is shown. The optical device is fabricated on c plane GaN substrates, which have defects that extend from the substrate material into and through the active layer of the optical device. Such defects can include both planar and line defects, including threading dislocations. Typically such defects exist with a surface density of at least $1 \times 10^6$ cm-2 in bulk GaN substrates. Such defects propagate along the direction of the c plane. As a result, by growing epitaxial layers on top of c plane GaN substrates, these defects extend into the epitaxial layer in which the optical devices are fabricated.

In device operation, the defects are disadvantageous, by dramatically degrading the electro-static discharge characteristics of the device. Specifically, the presence of defects within the p type, n type and active layers of the device provide regions that reduce the breakdown voltage of the device. This occurs as a result of electrostatic events that produce undesirable charge within the device. The defects serve as conduction pathways through which the charge is transmitted. The large amount of current that is generated within these defects, greatly increases device temperature and causes overall damage to the device, as the charge is not uniformly dissipated throughout the entire device. The subsequent damage and currents cause by individual or repeated electro-static discharge events decrease the break down voltage leading to reduced performance characteristics and subsequent failure of the LED device. Thus, in order to improve applications utilizing such LED devices it is often necessary to provide LEDs with improved electro-static discharge characteristics.

Figure 3:
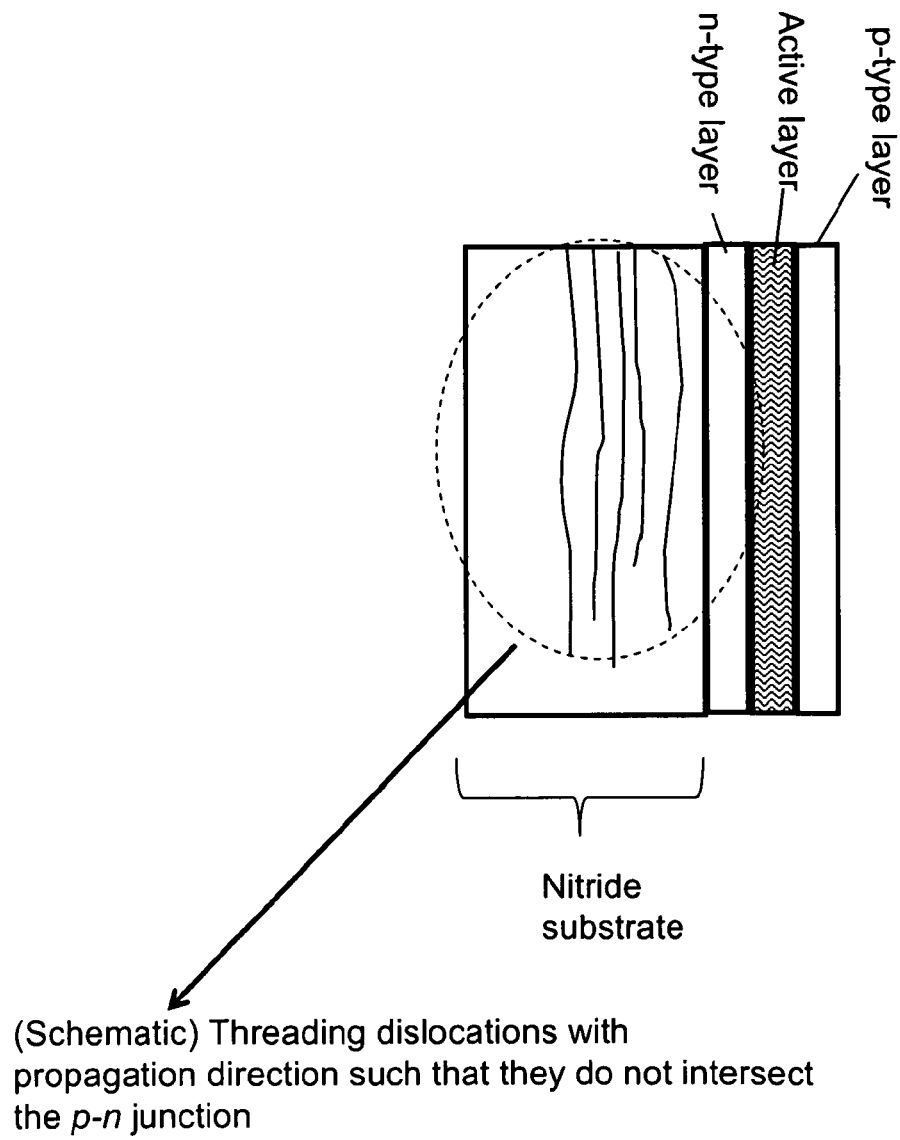
FIG. 3 is a simplified cross sectional view illustrating an optical device according to an embodiment of the present invention.

FIG. 3 shows a cross sectional view of the optical device of the present invention with improved electrostatic discharge characteristics according to a specific embodiment. The device includes an epitaxial layer grown on top of a bulk m plane GaN substrate. Bulk m plane GaN is created along the surface that is angled ranging from about 80-100 degrees from the polar orientation of the c plane towards an (h k l) plane wherein l=0, and at least one of h and k is non-zero. Bulk m plane GaN is non-polar leading to the emission of polarized light. Likewise, the bulk GaN material substrate of the present invention can be semipolar, by orientating the surface of the GaN material at an angle to the c plane. Specifically such angles can range from 0.1 to 80 degrees or 110-179.9 degrees from the polar c plane orientation described above towards an (h k l) plane wherein l=0, and at least one of h and k is non-zero in one or more embodiments. Optical devices fabricated on semipolar GaN substrates emit electromagnetic radiation of varying degrees of polarization. The degree of polarization is dependent upon the level of polarity of the GaN material from which the electromagnetic radiation is emitted. Such level of polarity of the GaN substrate is dependent upon the orientation of the GaN substrate surface with respect to the polar c plane.

The optical device of the present invention is fabricated within the epitaxial layer according to a specific embodiment. The device has a p type region layered on top of a n type region in order to create a diode structure. The active region is formed at the junction of the p and n type regions and includes another dopant in order to achieve improved light emission characteristics. The present device substantially eliminates the existence of defects extending from the substrate material into the actual device structure, including the active region in the epitaxial layer. As the defects typically are orientated along the c plane of the GaN substrate material, in using m plane GaN substrate material such defects are generally parallel to the surface of the GaN substrate material, and as a result do not extend into the epitaxial layer. Such defects still exist however at a surface density of at least $1 \times 10^6$ cm-2 within the bulk substrate material.

Figure 4:
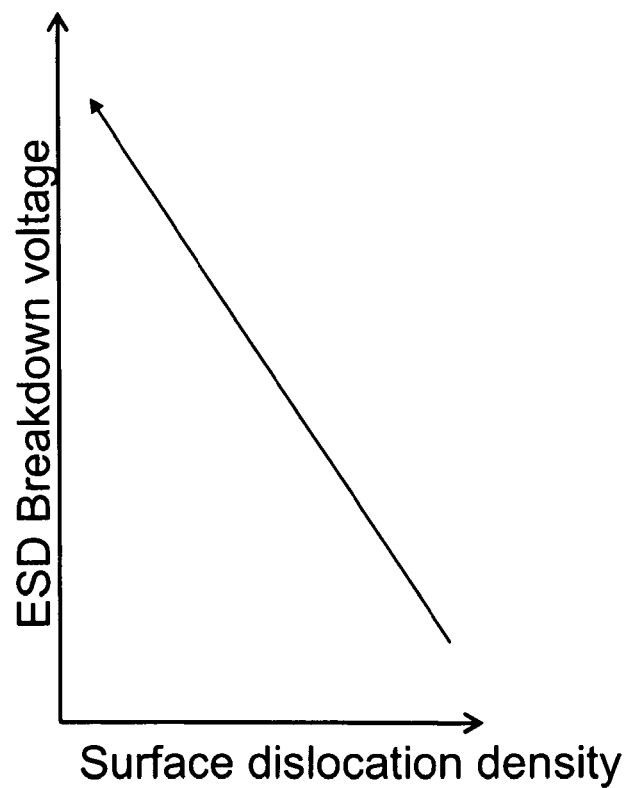
FIG. 4 is a simplified plot of ESD voltage rating against defect density according to an embodiment of the present invention.

By reducing the dislocation density within the epitaxial layer, and more specifically through the active layer of the optical device, the electro-static discharge characteristics of the optical device are improved. This leads to improve reliability of devices using such LED devices, including systems that use multiple LED arrays. Specifically, as shown in FIG. 4 as the surface dislocation density is decreased, the breakdown voltage of the device increases according to one or more embodiments. Devices with higher breakdown voltages are capable of withstanding greater amounts of electro-static discharge before device failure, thereby leading to improved electro-static discharge characteristics.

Figure 5:
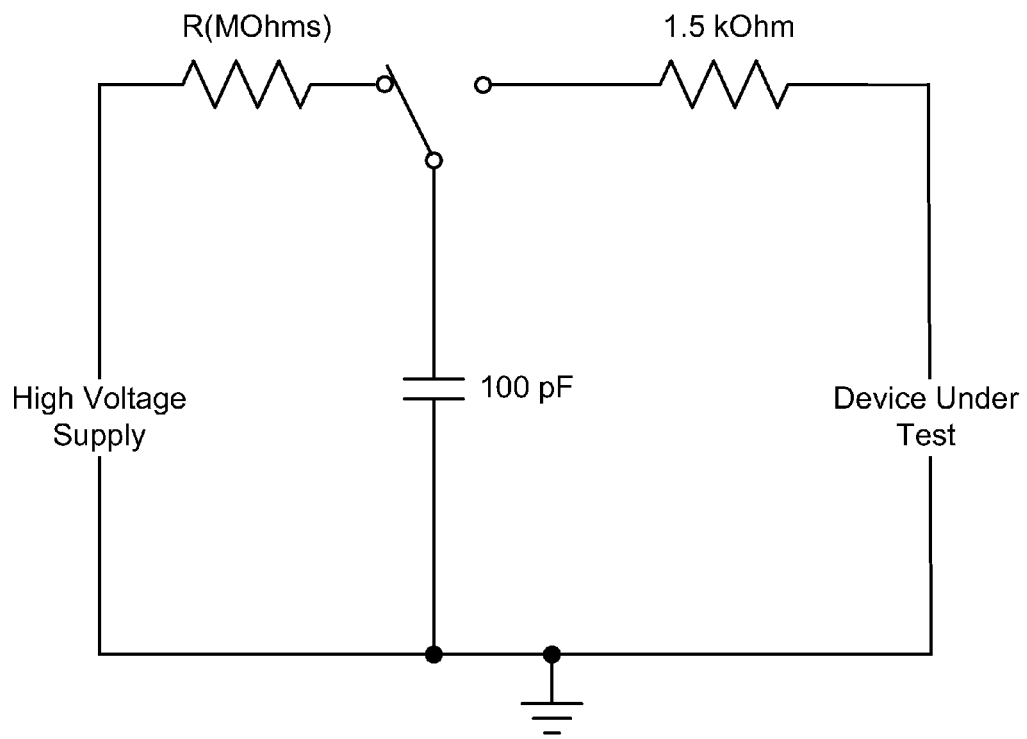
FIG. 5 is a simplified diagram of an equivalent circuit simulating the electro-static discharge that is used to test the ESD voltage breakdown characteristics of the LED according to an embodiment of the present invention.

In testing the electro-static discharge characteristics of an LED device, a model circuit, shown in FIG. 5, is designed to simulate the effect of electro-static discharge created through the contact of a human to the LED. The circuit includes a high voltage power source, couple in series with a resistor and through a switch to a capacitor. Once the capacitor becomes charged, the switch is activated such that the capacitor is in series with a resistor and the LED. The resistor corresponds to the resistance of the human body that electro-static discharge would encounter. As soon as the switch is activated, the capacitor discharges exposing the LED to a sudden high level of charge simulating an electro-static discharge event. The process can be repeated numerous times in order to expose the LED to multiple discharge events.

After the LED is exposed to single or numerous electro-static discharge events, the current voltage I-V relationship of the LED is characterized, to determine if breakdown of the device has occurred. The highest voltage caused by electro-static discharge at which the device can still operate is known as the ESD breakdown voltage. As shown previously the highest break down voltages are achieved when the surface defect density is minimized. As the surface defect density increases, the break down voltage decreases. LEDs that have higher ESD breakdown voltages are capable of withstanding either electro-static discharge events that generate greater amounts of charge, or multiple electro-static discharge events. The sensitivity of a device to electro-static discharge simulated by the human body model are categorized into specific classes as shown in FIG. 6, based upon the ESD breakdown voltage of the LED.

While the above is a full description of the specific embodiments, various modifications, alternative constructions and equivalents may be used. As an example, the packaged device can include any combination of elements described above, as well as outside of the present specification. Therefore, the above description and illustrations should not be taken as limiting the scope of the present invention which is defined by the appended claims.

What is claimed is:

1. An optical device comprising:
   a gallium nitride substrate structure, the gallium nitride substrate structure including a surface region;
   an epitaxial layer overlying the surface region;
   a p-n junction formed within a portion of the epitaxial layer;
   one or more plane or line defects spatially configured in a manner to be intersecting one or more spatial portions of the p-n junction, the one or more plane or line defects being characterized by a spatial density of less than $1 \times 10^4$ cm$^{-2}$; and
   an electrostatic discharge voltage rating of at least 7 kvolts;
   wherein the surface region is characterized by an m-plane that is angled ranging from about 80 degrees to about 100 degrees from the polar orientation of the c plane toward an (h k l) plane wherein l is 0 and at least one of h and k is non-zero.

2. The device of claim 1 wherein the gallium nitride substrate structure has an area of at least 4 square millimeters.

3. The device of claim 1 wherein the surface region is characterized as an m-plane.

4. The device of claim 1 wherein the gallium nitride substrate structure comprises an n-type impurity characteristic.

5. The device of claim 1 wherein the epitaxial layer comprises an n-type type characteristic and an p-type characteristic.

6. The device of claim 1 wherein the epitaxial layer comprises an n-type gallium nitride containing material, an overlying InGaN layer, and an overlying p-type gallium nitride containing material.

7. The device of claim 1 wherein the optical device is a light emitting diode.

8. The device of claim 1 wherein the optical device is a laser device.

9. The device of claim 1 wherein the p-n junction comprises a p-i-n junction.

\* \* \* \* \*